(12) United States Patent
Zhou et al.

(10) Patent No.: US 12,249,554 B2
(45) Date of Patent: Mar. 11, 2025

(54) POWER ELECTRONIC DEVICE ASSEMBLIES HAVING AN ELECTRICALLY INSULATING S-CELL

(71) Applicant: Toyota Motor Engineering & Manufacturing North America, Inc., Plano, TX (US)

(72) Inventors: Feng Zhou, Ann Arbor, MI (US); Tianzhu Fan, Houston, TX (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 247 days.

(21) Appl. No.: 18/162,905

(22) Filed: Feb. 1, 2023

(65) Prior Publication Data
US 2024/0258191 A1    Aug. 1, 2024

(51) Int. Cl.
*H01L 23/36* (2006.01)
*H01L 23/367* (2006.01)
*H01L 23/373* (2006.01)

(52) U.S. Cl.
CPC ...... *H01L 23/3675* (2013.01); *H01L 23/3735* (2013.01)

(58) Field of Classification Search
CPC . H01L 23/3735; H01L 23/473; H01L 23/367; H01L 23/5383; H01L 23/5389; H01L 23/5384; H01L 23/3736; H01L 2924/1517; H01L 31/024; H01L 2224/24137; H01L 2224/32225; H01L 2924/15153; H05K 7/20254;
(Continued)

(56) References Cited

U.S. PATENT DOCUMENTS

| 6,903,931 B2 | 6/2005 | Mccordic et al. |
| 7,742,307 B2 | 6/2010 | Ellsworth et al. |

(Continued)

FOREIGN PATENT DOCUMENTS

| CN | 110957288 A | 4/2020 |
| CN | 210868549 U | 6/2020 |
| KR | 102181194 B1 | 11/2020 |

OTHER PUBLICATIONS

Copper-graphite-copper sandwich: superior heat spreader with excellent heat-dissipation ability and good weldability https://pubs.rsc.org/en/content/articlelanding/2016/ra/c6ra00057f, Mar. 7, 2016.
(Continued)

*Primary Examiner* — Mandeep S Buttar
(74) *Attorney, Agent, or Firm* — DINSMORE & SHOHL LLP

(57) ABSTRACT

In one embodiment, a power electronics assembly includes a power device assembly further including an S-cell. The S-cell includes a first metal layer having a recess, a graphite layer bonded to the first metal layer, a second metal layer bonded to the graphite layer, and a ceramic layer, wherein the ceramic layer has a first metalized surface and a second metalized surface, and the first metalized surface is bonded to the second metal layer by a solder layer. The power electronics assembly further includes a power device disposed within the recess of the first metal layer, and a cold plate, wherein the second metalized surface of the ceramic layer is bonded to a surface of the cold plate.

20 Claims, 10 Drawing Sheets

(58) Field of Classification Search
CPC .. H05K 7/20927; H05K 1/185; H05K 1/0204; H05K 1/0206; H05K 1/05; H05K 7/209; H05K 1/0298; H05K 7/20509; H05K 1/0203; H05K 7/2089; H02M 7/003
USPC .......................................................... 257/712
See application file for complete search history.

(56) References Cited

U.S. PATENT DOCUMENTS

| | | |
|---|---|---|
| 2012/0298408 A1 | 11/2012 | Nagatomo et al. |
| 2017/0345736 A1* | 11/2017 | Miyairi ............... H01L 23/4334 |
| 2020/0152557 A1* | 5/2020 | Lim ........................ H01L 24/24 |
| 2021/0195810 A1* | 6/2021 | Joshi ...................... H02K 11/33 |
| 2021/0305121 A1 | 9/2021 | Mallik et al. |
| 2022/0157693 A1* | 5/2022 | Zhou ....................... H01L 25/50 |
| 2024/0038624 A1* | 2/2024 | Zhou .................. H05K 7/20254 |

OTHER PUBLICATIONS

Thin Copper-Graphite Composite Cold Plate and High Performance Al/Gr Composites for Thermal Management of High Density Electronics, https://www.sbir.gov/node/397963, Sep. 14, 2022.

* cited by examiner

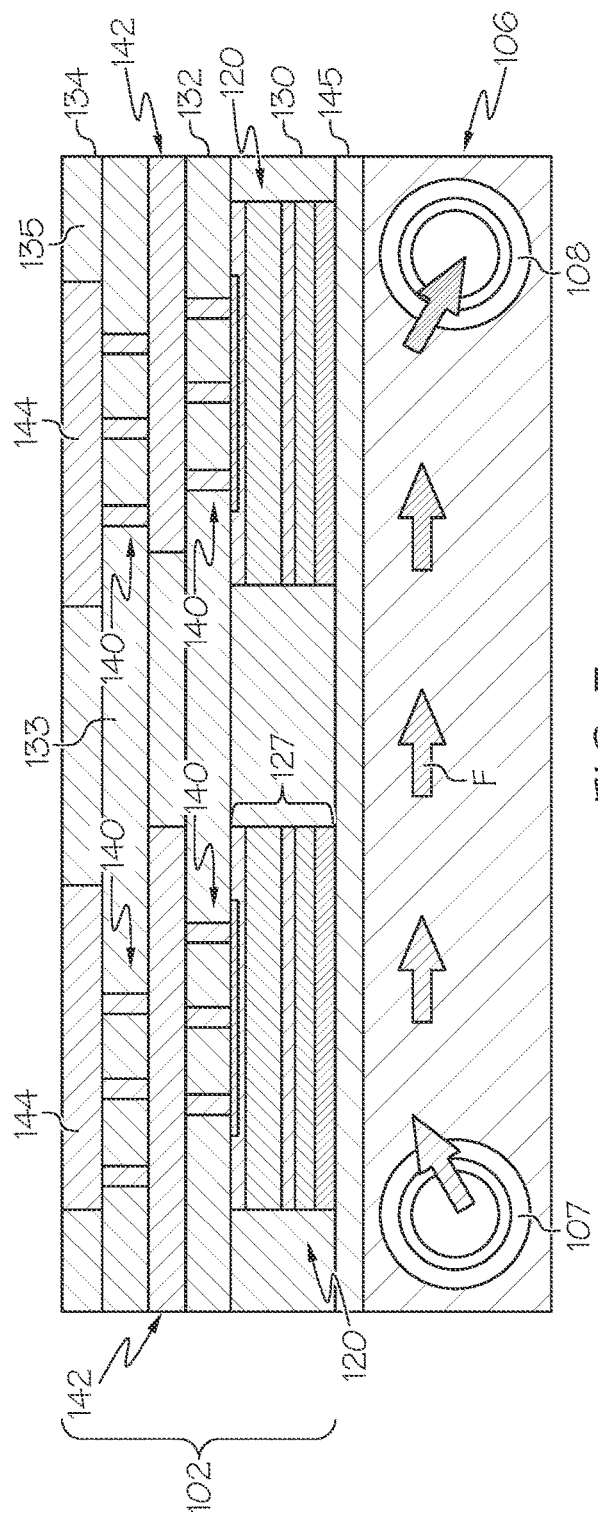
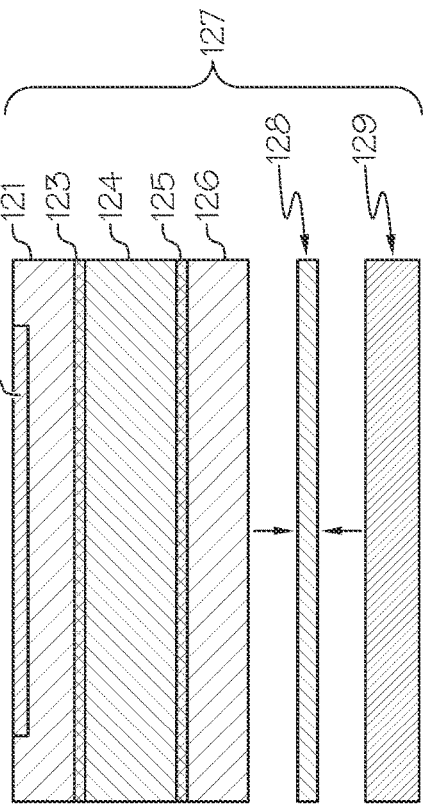
FIG. 3
FIG. 4A

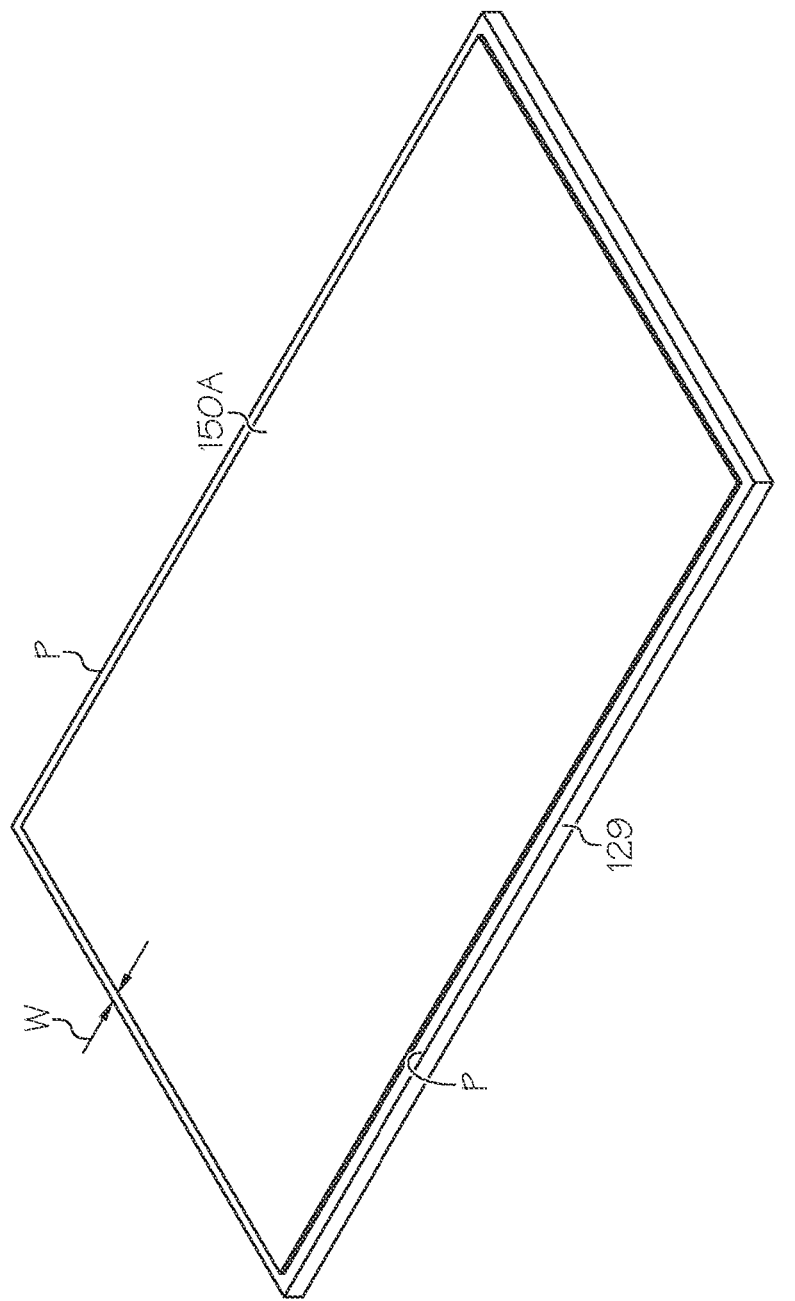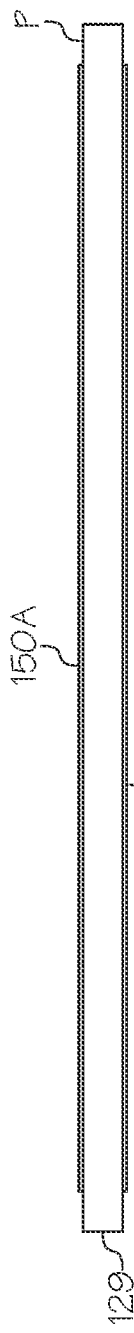

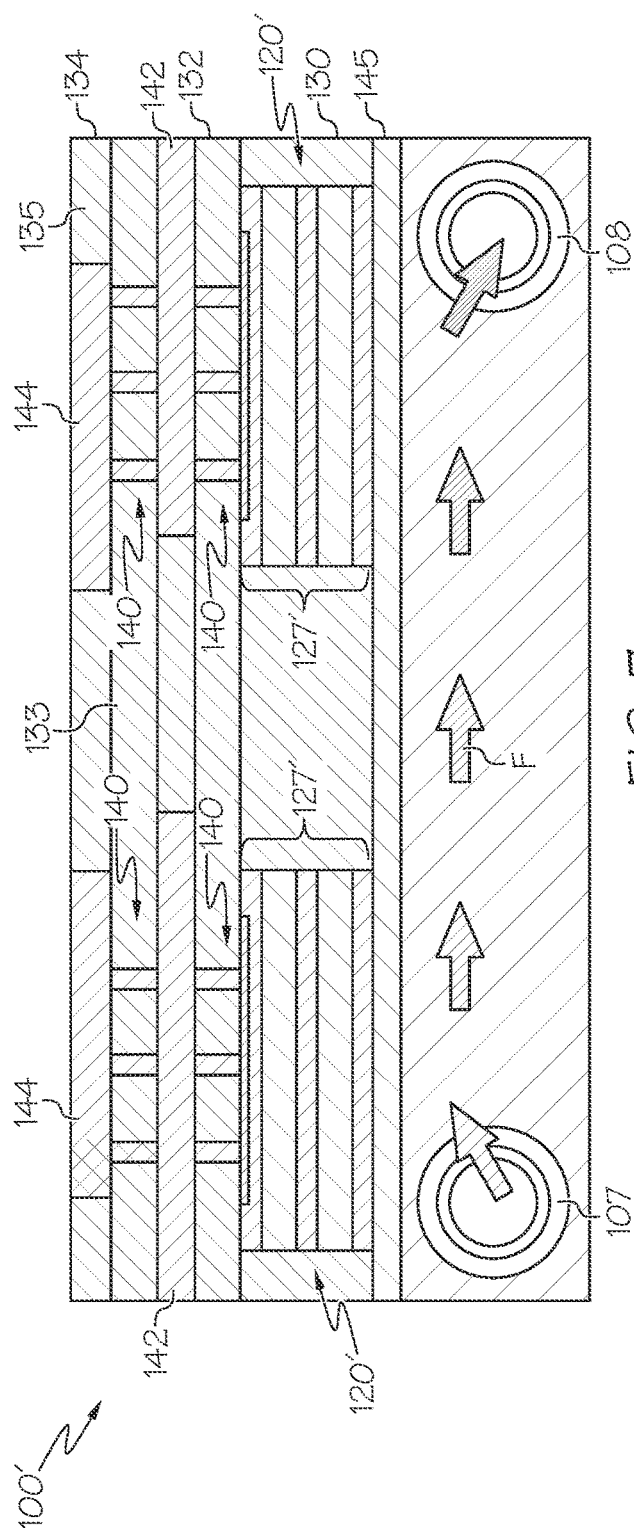
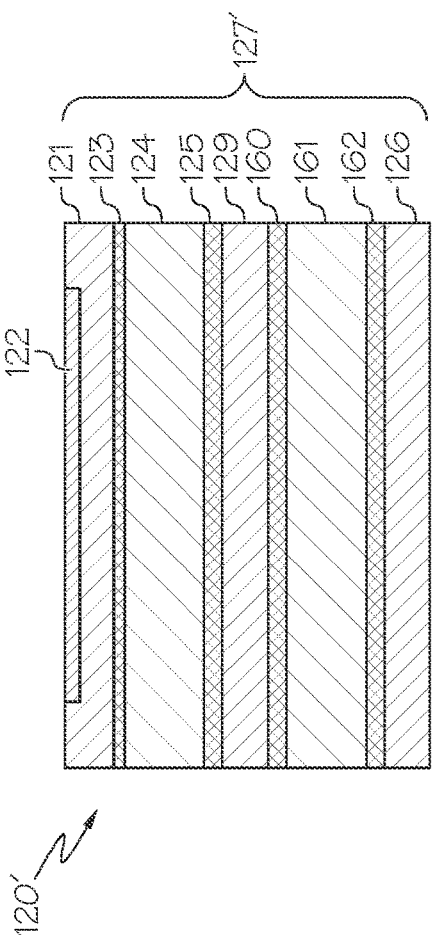
FIG. 7
FIG. 8

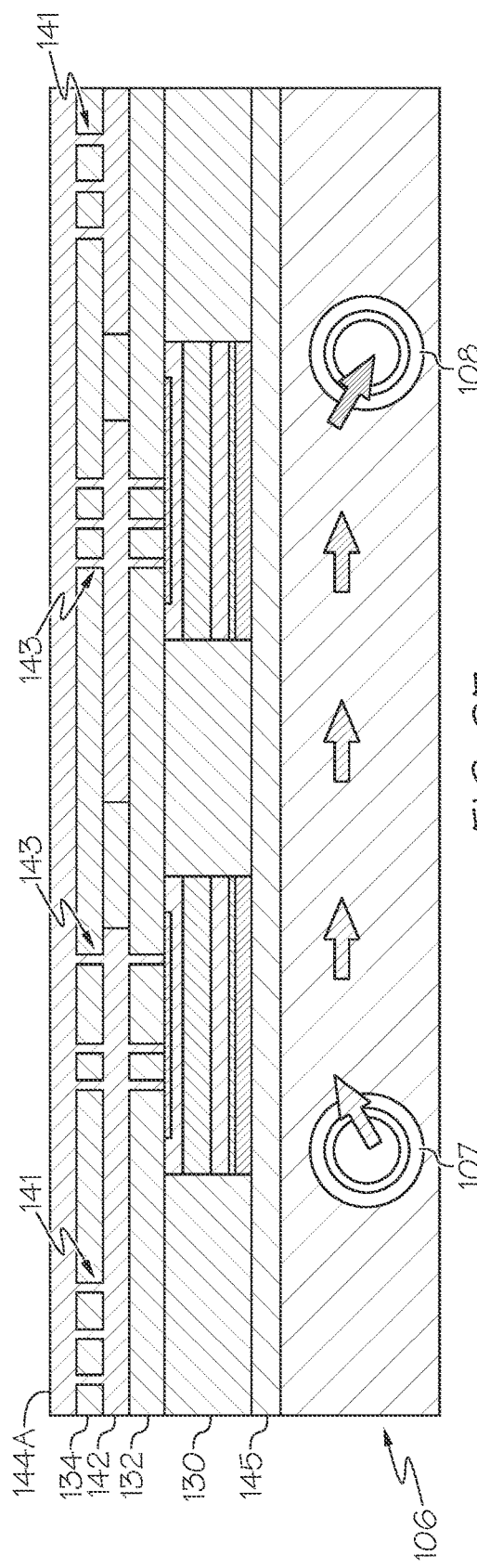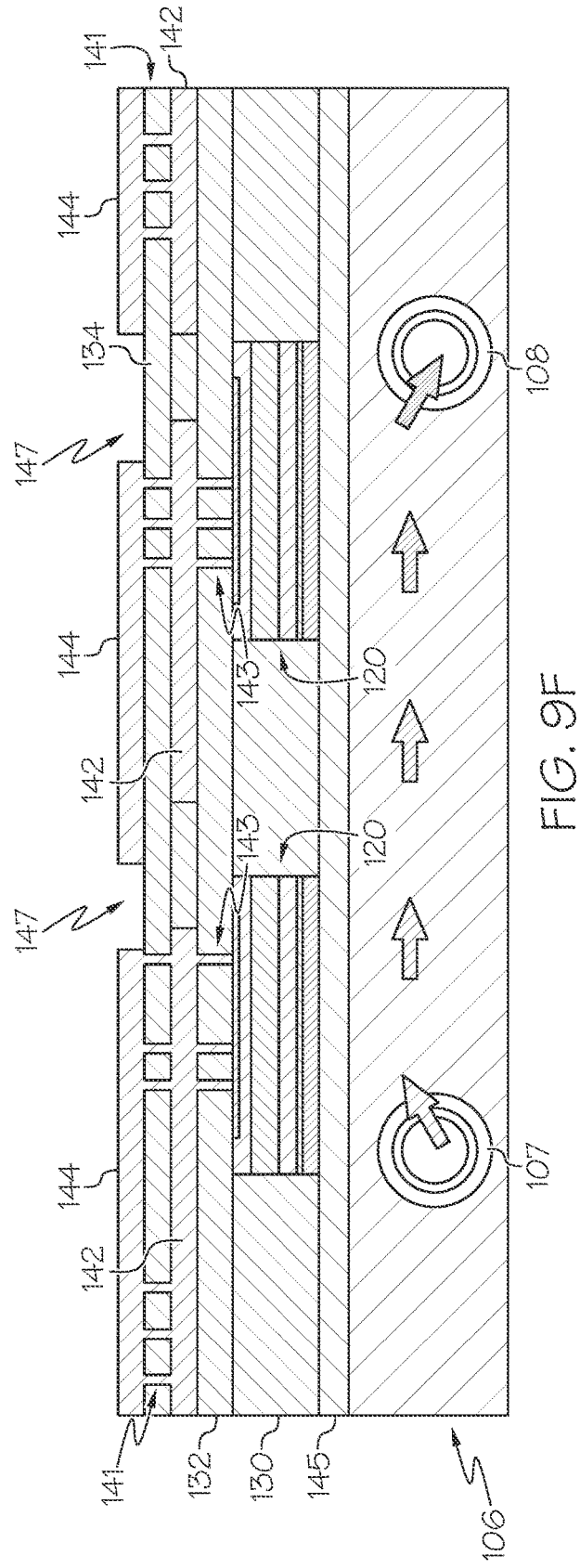

POWER ELECTRONIC DEVICE ASSEMBLIES HAVING AN ELECTRICALLY INSULATING S-CELL

TECHNICAL FIELD

The present specification generally relates to power electronic assemblies and, more specifically, apparatuses and methods for power electronic assemblies having low overall thermal resistance while achieving a compact package size.

BACKGROUND

Due to the increased use of electronics in vehicles, there is a need to make electronic systems more compact. One component of these electronic systems is a power electronic device used as a switch in an inverter circuit. Power electronic devices have large cooling requirements due to the heat generated.

Additionally, there has been a trend for power electronic devices conventionally composed of silicon to now be composed of silicon-carbide. The use of silicon-carbide causes a larger heat flux due to it defining a smaller device footprint. For these reasons, and more, there is a need to improve the cooling of power electronic devices while maintaining a compact package size.

SUMMARY

In one embodiment, a power electronics assembly includes a power device assembly further including an S-cell. The S-cell includes a first metal layer having a recess, a graphite layer bonded to the first metal layer, a second metal layer bonded to the graphite layer, and a ceramic layer, wherein the ceramic layer has a first metalized surface and a second metalized surface, and the first metalized surface is bonded to the second metal layer by a solder layer. The power electronics assembly further includes a power device disposed within the recess of the first metal layer, and a cold plate, wherein the second metalized surface of the ceramic layer is bonded to a surface of the cold plate.

In another embodiment, a power electronics assembly includes a power device assembly including an S-cell. The S-cell includes a first metal layer having a recess, a first graphite layer bonded to the first metal layer, a ceramic layer having a first metalized surface and a second metalized surface, wherein the first metalized surface is bonded to the first graphite layer, a second graphite layer bonded to the second metalized surface of the ceramic layer, a second metal layer bonded to the second graphite layer, and a power device disposed within the recess of the surface. The power electronics assembly further includes a cold plate, wherein the second metal layer is bonded to a surface of the cold plate.

In yet another embodiment, a method of fabricating a power electronics device assembly includes fabricating one or more power device assemblies by bonding a first metal layer to a first surface of a graphite layer, bonding a second metal layer to a second surface of the graphite layer, bonding the second metal layer to a first metalized surface of a ceramic layer, forming a recess within the first metal layer, and disposing a power device within the recess.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 3 illustrates a cross-sectional view of an example power electronics assembly according to one or more embodiments described and illustrated herein;

FIG. 4A illustrates a partially exploded view of a power device assembly according to one or more embodiments described and illustrated herein;

FIG. 5 illustrates a perspective view of an example metalized surface ceramic layer according to one or more embodiments described and illustrated herein;

FIG. 6 illustrates a side view of the example metalized surface ceramic layer of FIG. 5 according to one or more embodiments described and illustrated herein;

FIG. 7 illustrates a cross-sectional view of another example power electronics assembly according to one or more embodiments described and illustrated herein;

FIG. 8 illustrates a cross-sectional view of an example power device assembly of the example power electronics assembly of FIG. 7 according to one or more embodiments described and illustrated herein; and FIGS. 9A-9F illustrate an example method of fabricating a power electronics assembly according to one or more embodiments described and illustrated herein.

DETAILED DESCRIPTION

Figure 1:
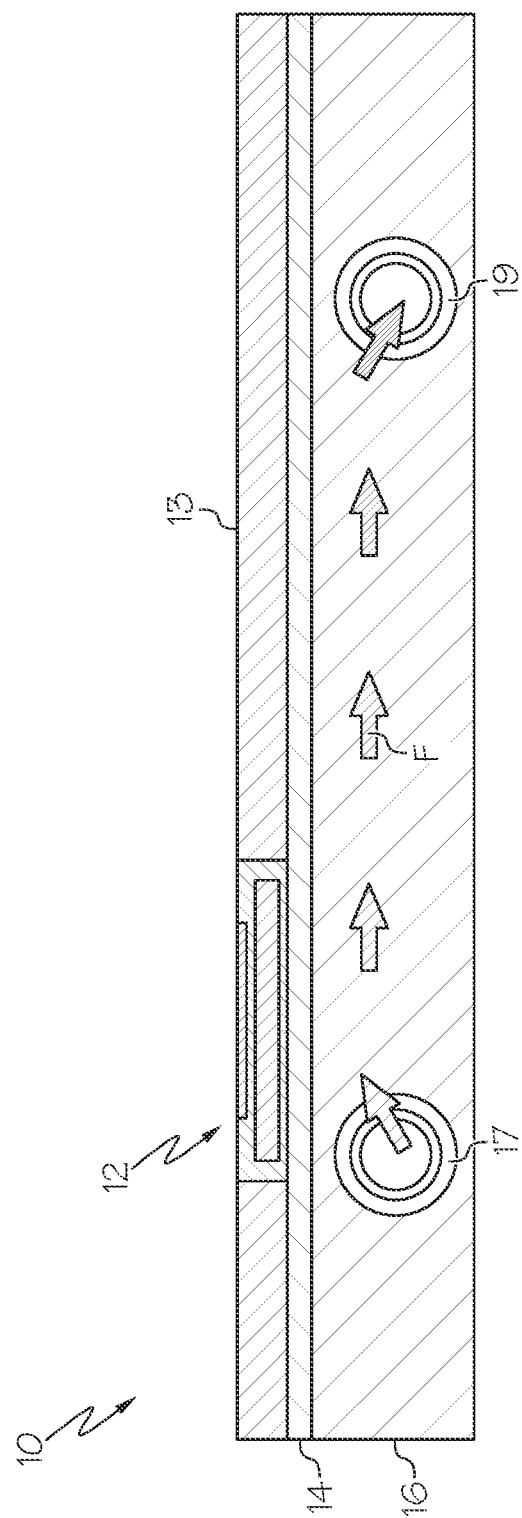
FIG. 1 illustrates a conventional power electronics assembly.

Embodiments described herein are generally directed to power electronics assemblies having one or more power device assemblies embedded directly into a circuit board, such as a printed circuit board. Previous assemblies utilized an insulating metal substrate (IMS) layer between a power device assembly and a cold plate. Referring to FIG. 1, a prior art power electronics assembly including a cold plate 16, an IMS layer, a circuit board 13 and a power device 12 is shown. As the cold plate 16 is typically made of a metal (e.g., aluminum or copper) and is electrically conductive, electrical insulation should be provided between the power device 12 and the cold plate 16 to prevent electrical shorting. However, the presence of the IMS layer 14 still contributes to the overall thermal resistance and thickness of the package. Thus, removal of the IMS layer 14 may be desired to both improve thermal performance and reduce the package size.

Embodiments of the present disclosure incorporate a metalized ceramic layer within each power device assembly to provide electrical insulation. Removal of the common electrical insulation layer across the cold plate reduces the thermal resistance between the power electronics devices and the cold plate, thereby improving thermal performance.

Further, removal of the electrical insulation layer also reduces the overall package size of the power device assembly.

The power device assemblies of the present disclosure comprise a power electronics device affixed to a mounting substrate referred to herein as an S-cell. As described in more detail below, the S-cell includes a metalized ceramic layer that electrically insulates the bottom electrodes of the power electronics device from other components of the power device assembly. For example, the integral electrically insulating layer of the S-cell enables the removal of the electrical insulation layer between the printed circuit board and the cold plate because the electrical isolation is provided by the S-cell itself.

As described in more detail below, the S-cells of the present disclosure provide enhanced thermal properties due to graphite layers that promote heat flux flow toward a cold plate. The S-cells described herein comprise stacked metal, graphite, and a metalized ceramic layer in a compact package.

The power electronic device assemblies and the power device assemblies described herein may be used in electrified vehicles, such as and without being limited to, an electric vehicle, a hybrid electric vehicle, any electric motor, generators, industrial tools, household appliances, and the like. The power electronics assemblies described herein may be electrically coupled to an electric motor and/or a battery and be configured as an inverter circuit operable to convert direct current (DC) electrical power to alternating current (AC) electrical power.

As used herein, a "power device" means any electrical component used to convert DC electrical power to AC electrical power and vice-versa. Embodiments may also be employed in AC-AC converter and DC-DC converter applications. Non-limiting examples of power electronics devices include power metal-oxide-semiconductor field effect transistors (MOSFET), insulated-gate bipolar transistors (IGBT), thyristors, and power transistors.

As used herein, an "S-cell" is a mounting substrate operable to be affixed to a power device and includes one or more of a metal layer, a graphite layer and an electrically insulating layer. As used herein, "power device assembly" means a power device mounted to an S-cell. As used herein, "power electronics assembly" means a power device assembly embedded within a circuit board substrate and mounted to a cold plate.

As used herein, the phrase "fully embedded" means that each surface of a component is surrounded by a substrate. For example, when a power device assembly is fully embedded by a circuit board substrate, it means that the material of the circuit board substrate covers each surface of the circuit board substrate. A component is "partially embedded" when one or more surfaces of the component are exposed.

Various embodiments of power device assemblies and power electronics assemblies are described in detail below. Whenever possible, the same reference numerals will be used throughout the drawings to refer to the same or like parts.

Figure 2:
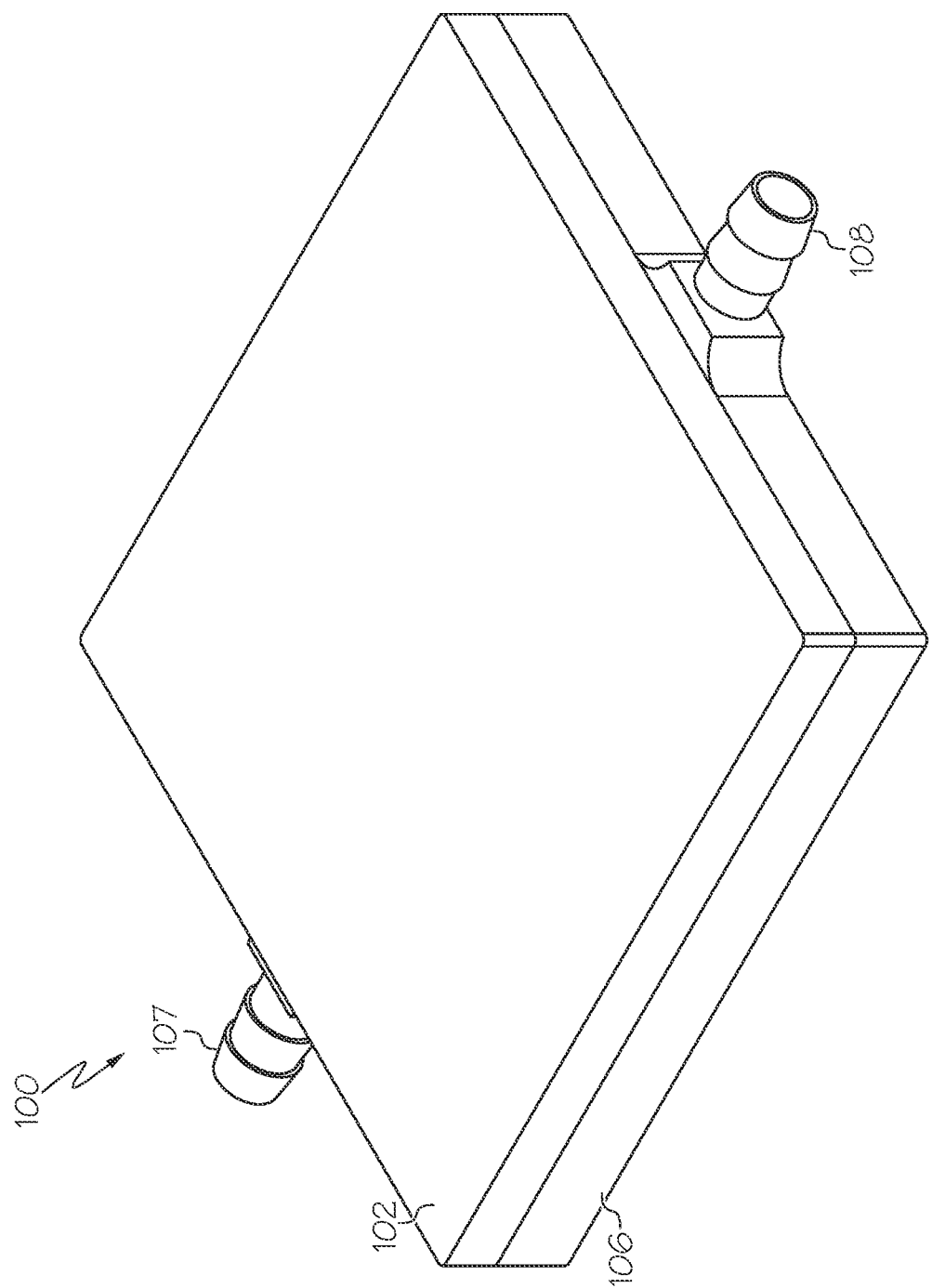
FIG. 2 illustrates a perspective view of an example power electronics assembly according to one or more embodiments described and illustrated herein.

Referring now to FIG. 2, an example power electronics assembly 100 is illustrated in a perspective view. The power electronics assembly 100 generally includes a cold plate 106 and a circuit board assembly 102 mounted to a surface of the cold plate 106. The cold plate 106 may be any device capable of removing heat flux from power devices 122 (see FIG. 3) embedded within the dielectric material of the circuit board assembly 102. Non-limiting examples for the cold plate include heat sinks, single-phase liquid cooling, two-phase liquid cooling, a vapor chambers. The example cold plate 106 includes a fluid inlet 107 and a fluid outlet 109 fluidly coupled to a fluid chamber (not shown) within the cold plate 106. Cooling fluid F from a reservoir (not shown) flows into the fluid chamber through the fluid inlet 107 and out of the fluid chamber 115 through the fluid outlet 109, where it is returned to the reservoir, such as after flowing through a heat exchanger (not shown) to remove heat from the cooling fluid. Although not shown, an array of fins may be provided in the fluid chamber to provide additional surface area for heat transfer to the cooling fluid.

The circuit board assembly 102 is affixed to a first surface of the cold plate 106. The circuit board assembly 102 may affixed to the first surface of the cold plate 106 by a bond layer 104 configured as a solder layer. It should be understood that other bonding methods may be utilized.

Referring now to FIG. 3, a cross-sectional view of an example power electronics assembly 100 is illustrated. A circuit board assembly 102 is bonded to the first surface of the cold plate 106 by a bonding layer 145. The bonding layer 145 may be a solder layer or, in another example, a metalized epoxy. The circuit board assembly 102 comprises several layers of a dielectric material. The dielectric material may be a material used in the fabrication of printed circuit boards, such as, without limitation, FR-4. The circuit board assembly 102 further comprises embedded electrically conductive layers, a plurality of vias (both electrically conducting vias and thermal vias), and a plurality of power device assemblies 120. As a non-limiting example the circuit board assembly 102 may include six power device assemblies 120 for an inverter circuit for an electric vehicle. However, it should be understood that any number of power device assemblies may be utilized depending on the application.

More particularly, the circuit board assembly 102 includes a first dielectric layer 130 having a plurality of openings in which a plurality of power device assemblies 120 are disposed. Thus, the first dielectric layer 130 surrounds the minor surfaces of the plurality of power device assemblies 120. A second dielectric layer 132 is disposed on top of the first dielectric layer 130 and the plurality of power device assemblies 120. Thus, the plurality of power device assemblies 120 are embedded within the circuit board assembly 102 such that only the bottom surface of the plurality of power device assemblies 120 are exposed.

A first power layer 133 having a plurality of electrically conductive regions 142 (e.g., copper pads) disposed between dielectric material is positioned on top of the second dielectric layer 132. A third dielectric layer 134 is disposed on top of the first power layer 133. A second power layer 135 having a plurality of electrically conductive regions 144 (e.g., copper pads) disposed between dielectric material is positioned on top of the third dielectric layer 134. A plurality of vias (e.g., first vias 143 and second vias 140) through the various layers provide power and signal control electrical connections.

It is noted that one or more logic dielectric material layers (not shown) may be further disposed on the third dielectric layer 134, with additional vias provided through any number of the various layers.

Figure 4B:
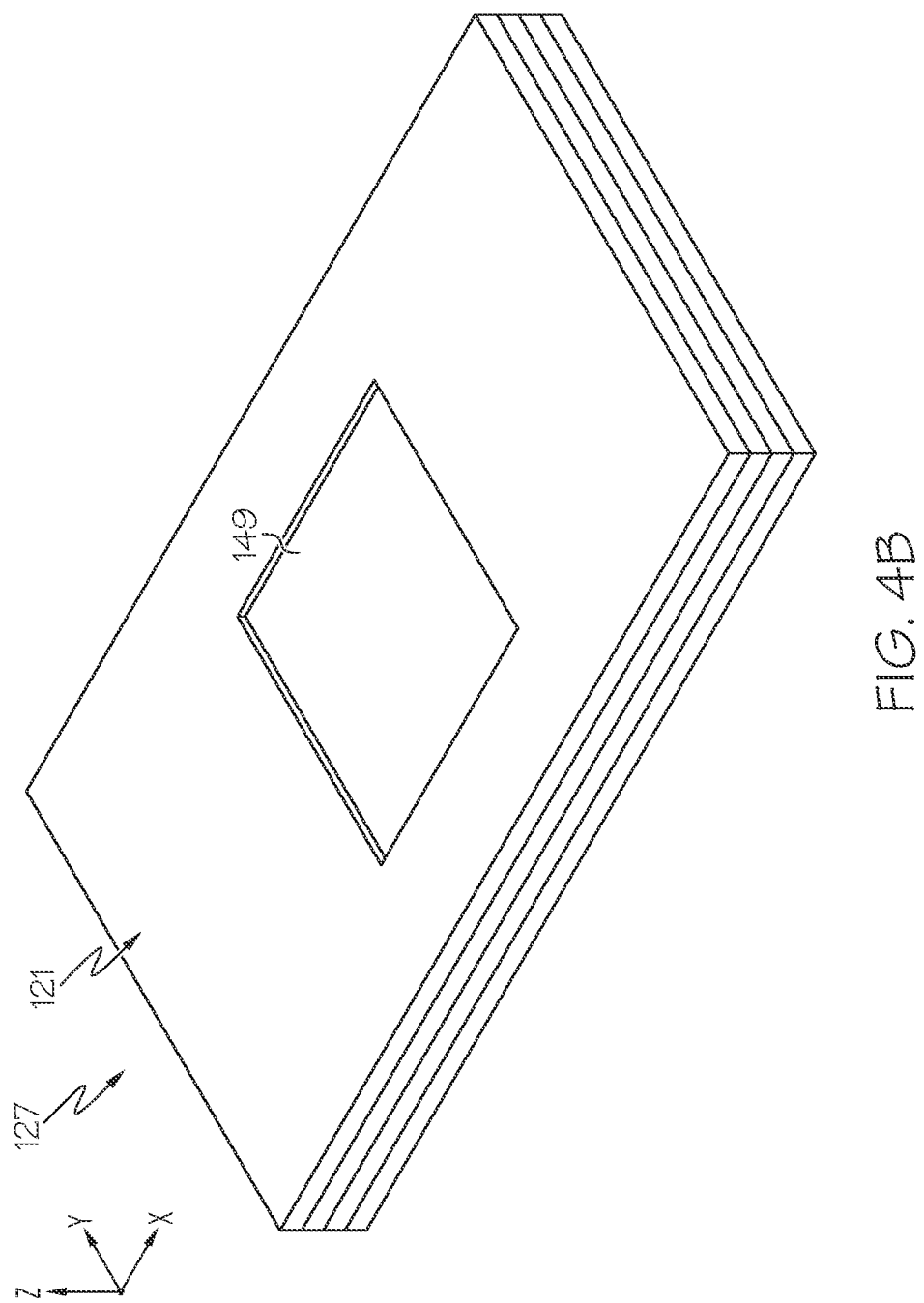
FIG. 4B illustrates a perspective view of an example S-cell according to one or more embodiments described and illustrated herein.

FIG. 3 illustrates a two fully assembled example power device assemblies 120 while FIG. 4 illustrates a partially exploded view of an example power device assembly 120. FIG. 4B illustrates a perspective view of an example S-cell 127. Each power device assembly 120 includes an S-cell 127 and a power device 122 affixed to the S-cell 127. As stated above, the S-cell 127 is a stacked substrate to which the power device 122 is bonded. It provides an electrically conductive surface area to make electrical connections to electrodes on the bottom surface of the power device 122. The S-cell 127 further provides heat spreading functionality as well as electrical isolation. By providing electrical isolation in the S-cell 127, a separate IMS acting as an electrical isolation layer between the circuit board assembly 102 and the cold plate 106 is not needed (although it may be optionally provided in some embodiments).

The S-cell 127 includes a plurality of stacked layers. Particularly, the S-cell 127 illustrated by FIGS. 3 and 4A include a first metal layer 121, a graphite layer 124, a second metal layer 126, and a ceramic layer 129. The first and second metal layers 121, 126 may be made of any suitable metal or alloy. Copper and aluminum may be used as the first and second metal layers 122, 126 as non-limiting examples.

As shown in FIG. 4B, the first metal layer 121 includes a recess 149 having dimensions to receive a power device 122. As described in more detail below, the first metal layer 121 provides an electrically conductive surface to which electrically conductive vias may contact to make an electrical connection to electrodes on a bottom surface of the power device 122.

As a non-limiting example, the first and second metal layers 121, 126 of the S-cell 127 may be bonded to the graphite layer 124 by a high-temperature, active metal brazing method that forms bond layers 123, 125 (i.e., active brazing layers). However, it should be understood that the various layers may be bonded using other known and yet-to-be-developed techniques. The second metal layer 126 may be bonded to the metalized ceramic layer 129 by a solder layer 128, for example.

The graphite layer 124 is provided to encourage heat spreading both across the S-cell 127 as well as toward the cold plate 106. The crystalline structure of graphite provides it with high thermal conductivity making it useful to conduct heat flux toward the cold plate 106. However, graphite does not have an isothermal profile. Rather, graphite has an anisothermal profile with high conductivity along two axes and low thermal conductivity in a third axis. To account for the anisothermal profile of graphite, the S-cell 127 may be designed to be rectangular in shape such that its length dimension is larger than its width dimension. Referring to FIG. 4B, the graphite layer 124 has a high thermal conductivity along the x-axis and the z-axis. Thus, the S-cell 127 is designed such that its dimension along the x-axis is larger than its dimension along the y-axis. Heat flux will travel along the x- and z-axes. Thermal vias may be provided at the edges of the S-cell 127 along the x-axis to receive heat flux and move it toward the cold plate 106. Heat flux will also travel along the z-axis toward the cold plate 106.

The ceramic layer 129 is a metalized ceramic that provides electrical insulation for the power device 122. As non-limiting examples, the ceramic layer 129 may be made of silicon nitride or aluminum nitride. The material chosen for the electrically ceramic layer 129 should have a high thermal conductivity so that heat flux may flow through the electrically insulating layer 124 toward the cold plate 106.

FIG. 5 illustrates a perspective view of an example ceramic layer 129 and FIG. 6 illustrates a side view of the example ceramic layer 129. The ceramic layer 129 is a surface-metalized ceramic layer having a first metalized surface 150A and a second metalized surface 150B at both major surfaces of the ceramic layer 129. In the illustrated embodiment, the first metalized surface 150A and the second metalized surface 150B do not extend all the way to a perimeter edge P of the ceramic layer 129, thereby providing a gap with a width W. This gap provides further electrical isolation and prevents electrical shorting along the minor surfaces of the S-cell 127.

As a non-limiting example, the first metalized surface 150A and the second metalized surface 150B may be Ti—TiW—Cu—Ni—Au, which is suitable for Au-based solders (e.g., AuSn solder), Sn based solders (e.g., SAC305), or Ag epoxies. Other materials for the first metalized surface 150A and the second metalized surface 150B may be utilized. The material for the first metalized surface 150A and the second metalized surface 150B may depend on the bonding technique that is utilized.

The ceramic layer 129 in the S-cell 127 electrically insulate each power device 122 with respect to the cold plate 106. Accordingly, there is no longer a need to laminate an IMS layer between the cold plate 106 and the circuit board assembly. Instead, a common bonding layer 145 with high thermal conductivity and less cost than the IMS layer can be applied to attach the S-cells 127 on the surface of the cold plate 106.

Referring once again to FIG. 3, electrical connection to electrodes of the power devices 122 and the first metal layer 121 may be made by a plurality of vias 140. These vias 140 may provide drive signals to the power devices 122, as well as provide a current path for switching current. It is noted that, in some embodiments, some of the vias 140 may be configured as thermal vias that do not conduct drive signals or switching current. For example, these vias may be thermally conductive-only vias that are provided to conduct heat flux toward a bottom layer that is close to the cold plate 106. In this way, heat flux is optimally directed away from the power devices 122 and toward the cold plate 106. As shown in FIG. 3, cold cooling fluid F enters the cold plate 106 through the fluid inlet 107, flows through the fluid chamber, and exits as warmed cooling fluid out of the fluid outlet 109.

The S-cell 127 shown in FIGS. 3-5 have four layers with bonding layers therebetween. In some embodiments, the S-cell may have five layers. Due to differing coefficients of thermal expansion (CTE) between the metals layers and the graphite layer, it may be desirable to have a symmetrical number of metal layers and graphite layers to minimize the effect of different CTE during the high temperature active brazing process that bonds the metal layers to the graphite layer(s).

FIG. 7 illustrates an example power electronics assembly 100' having power device assemblies 120' with five-layer S-cells 127'. FIG. 8 illustrates a cross-sectional view of the example S-cell 127' of FIG. 7. Rather than a single graphite layer, the S-cell 127' of FIGS. 7 and 8 have two graphite layers 124 and 161. More particularly, the S-cell 127' has a first metal layer 121 having a recess to receive a power device 122, a first graphite layer 124, a metalized surface ceramic layer 129, a second graphite layer 161, and a second metal layer 126. Having two metal layers and two graphite layers provides symmetry in the z-axis direction, thereby minimizing thermally induced stress during the high temperature active brazing process.

Figure 9A:
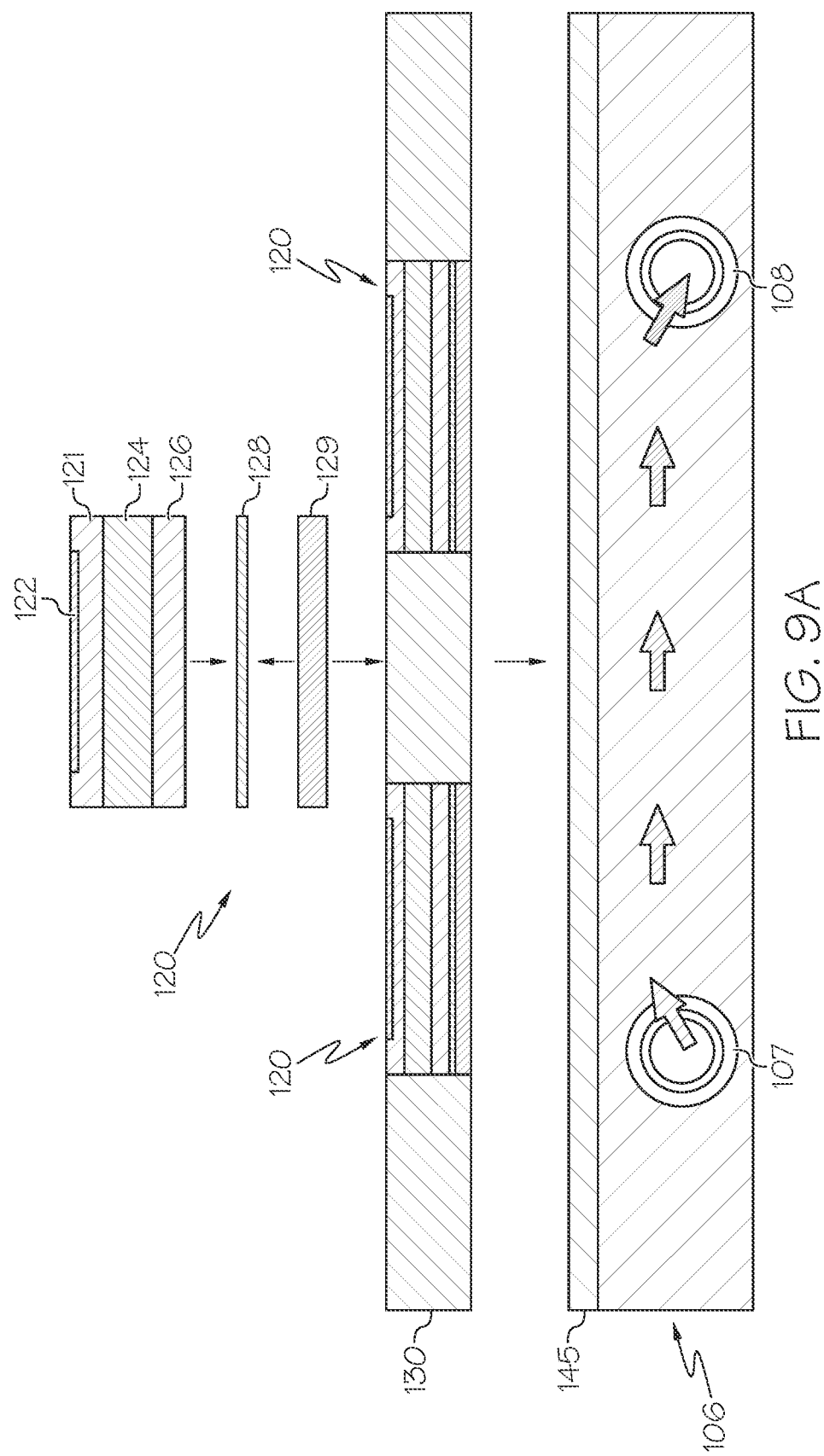

FIGS. 9A-9F illustrate an example method of fabricating a power electronics assembly. For fabrication of a four-layer S-cell 127, a metal-graphite-metal S-cell is first processed by active brazing at the metal-graphite interfaces. Then the surface metalized ceramic layer 129 is soldered to the second metal layer 126 using a solder layer 128, as shown in FIG. 9A. Therefore, the concern of thermal stress at the interface of the ceramic layer 129 and remaining layers of the S-cell 127 is negligible. Next, the S-cells 127 are processed to have the recesses 149 and the power devices are bonded into the recesses 149 (e.g., by soldering). The recesses 149 may be fabricated by laser or chemical etching processes, for example.

Next, the resulting power device assemblies 120 are disposed in power device openings of a first dielectric layer 130, which may be an FR-4 circuit board, for example. It should be understood that other materials for the dielectric layers described herein may be utilized. The power device openings are sized to accept the power device assemblies 120. Then, the power device assemblies 120 and the first dielectric layer 130 are bonded to a top surface of the cold plate 106 by a bonding layer 145. The bonding layer 145 need not be high temperature or electrically insulating. The bonding layer 145 may be a solder layer or a metal-filled epoxy, as non-limiting examples.

Figure 9B:
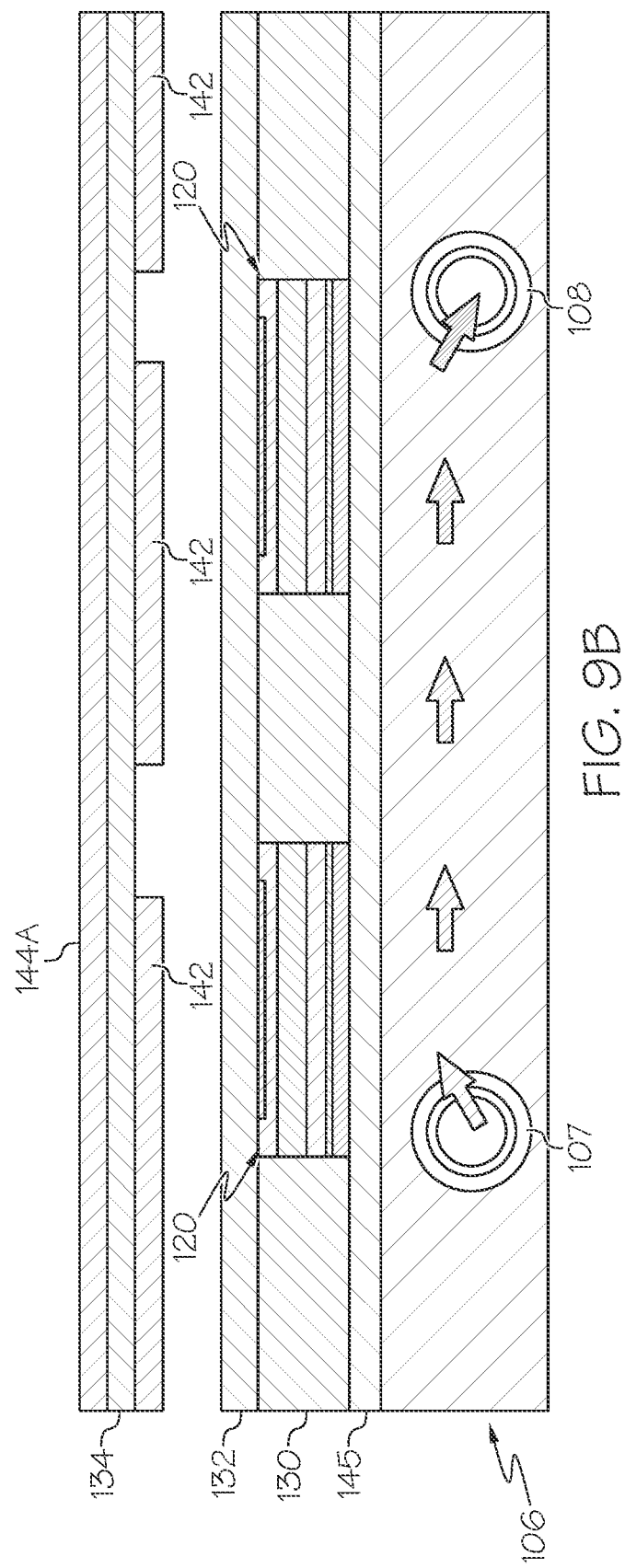

Next, a second dielectric layer 132 is disposed on the power device assemblies 120 and the first dielectric layer 130, as illustrated by FIG. 9B. A power layer subassembly including a third dielectric layer 134, a first power layer 133, and a second power layer 144A. The first power layer 133 is etched to form one or more electrically conductive regions according to a trace pattern. The second power layer 144A is unetched at this time.

Figure 9C:
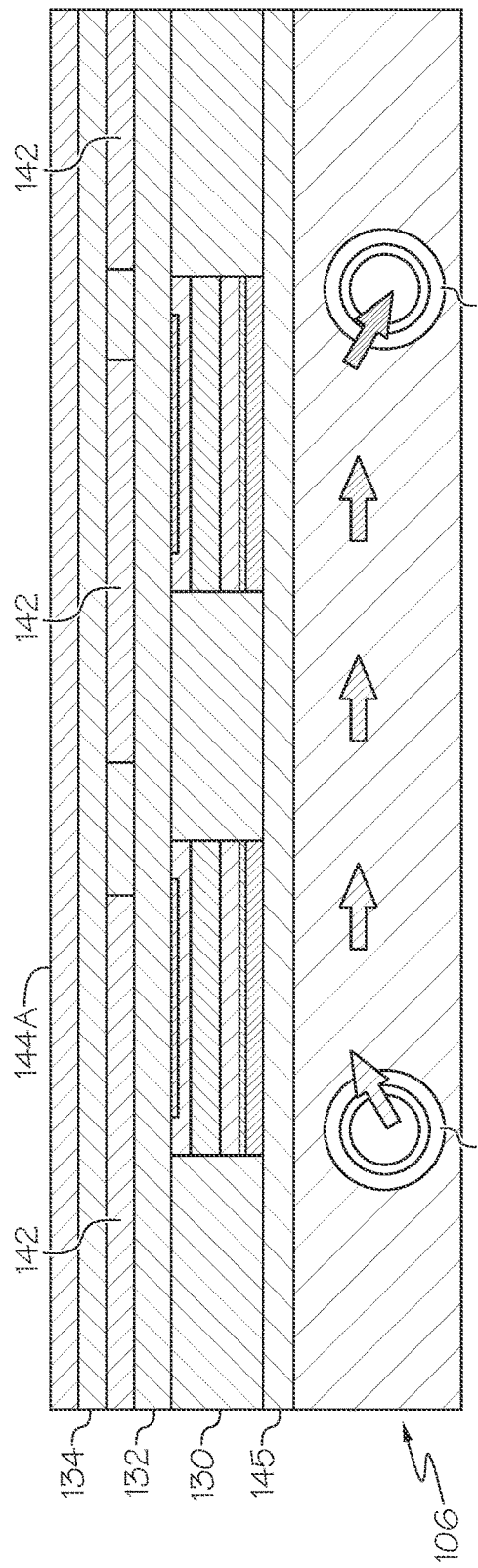

As shown in FIG. 9C, the power layer subassembly is bonded to the second dielectric layer 132, for example, using a high-temperature, high pressure chamber. A dielectric material used in the bonding process fills in the gaps between the electrically conductive regions 142 within the first power layer 133 (i.e., one or more insulation regions).

Figure 9D:
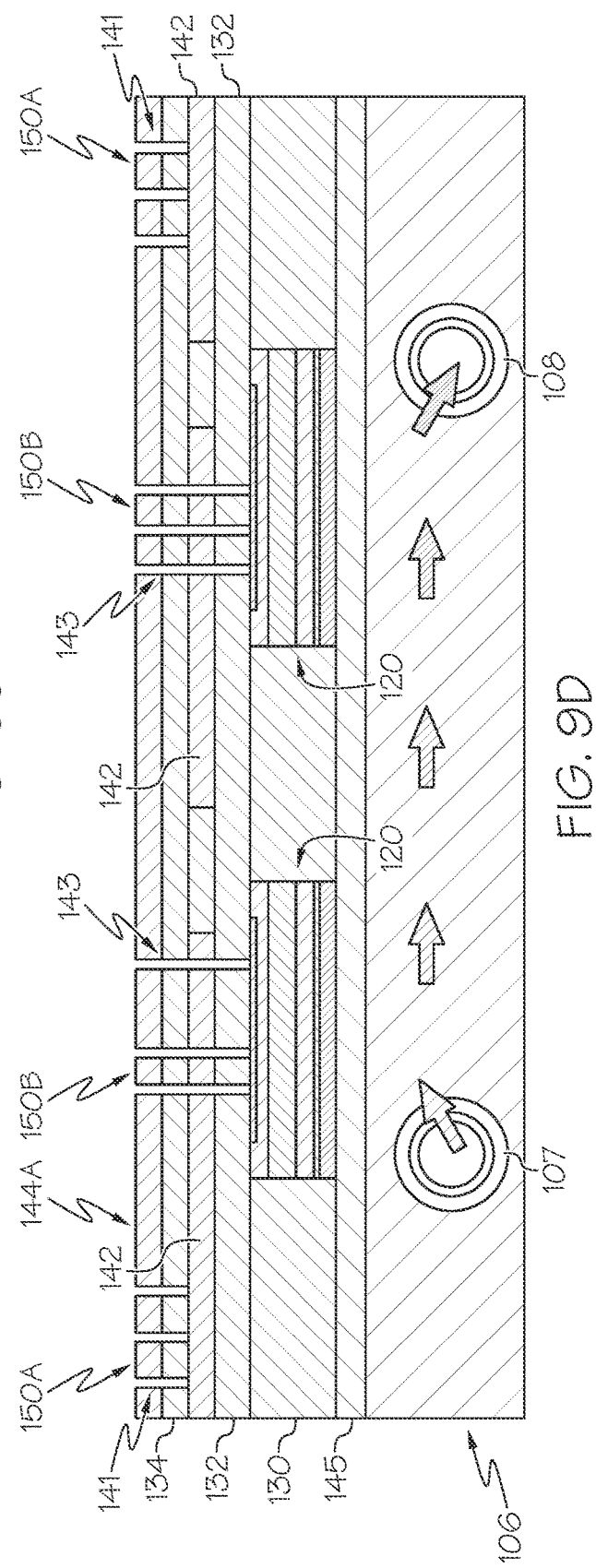

Referring now to FIG. 9D, a plurality of vias are drilled through various layers of the stack. As a non-limiting example, a plurality of first vias 141 are drilled through the second power layer 144A and the third dielectric layer 134, and a plurality of second vias 143 are drilled through the second power layer 144A, the third dielectric layer 134, the first power layer 133, and the second dielectric layer 132. It should be understood that the placement of the various vias in FIG. 9D is for illustrative purposes only, and that the embodiments are not limited by the placement of vias. The plurality of vias may be fabricated by laser drilling, for example. The plurality of vias may provide electrical connections for switched power and gate drive/control signals for controlling the power devices 122. The some of the vias may also be thermal vias that make no electrical connections.

Next, as shown in FIG. 9E, the plurality of vias 141, 143 are electroplated to fill them with an electrically conductive material, such as copper. Finally, the second power layer 144A is etched to form a second power layer 144 having one or more electrically conductive regions, as shown in FIG. 9F. Additional gate-drive/logic layers (not shown) may also be applied to the second power layer 144 in a similar process It should now be understood that embodiments of the present disclosure are directed to methods, power device assemblies, and power electronics assemblies comprising an S-cell that is fully embedded within a circuit board substrate. The S-cell of the embodiments described herein include one or more internal graphite layers to improve thermal performance, as well as an internal surface-metalized ceramic layer that provides electrical isolation. The electrical isolation of the S-cell enables the removal of an IMS layer between the circuit board and the cold plate. The embedding of the power device assemblies directly into the circuit board, as well as the removal of a separate IMS layer between the circuit board and the cold plate, significantly reduces the overall size of the power electronics assembly while also providing enhanced thermal performance.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

It will be apparent to those skilled in the art that various modifications and variations can be made to the embodiments described herein without departing from the scope of the claimed subject matter. Thus, it is intended that the specification cover the modifications and variations of the various embodiments described herein provided such modification and variations come within the scope of the appended claims and their equivalents.

The invention claimed is:

1. A power electronics assembly comprising:
   a power device assembly comprising:
      an S-cell comprising:
         a first metal layer comprising a recess;
         a graphite layer bonded to the first metal layer;
         a second metal layer bonded to the graphite layer; and
         a ceramic layer, wherein the ceramic layer comprises a first metalized surface and a second metalized surface, and the first metalized surface is bonded to the second metal layer by a solder layer;
      a power device disposed within the recess of the first metal layer; and
   a cold plate, wherein the second metalized surface of the ceramic layer is bonded to a surface of the cold plate.

2. The power electronics assembly of claim 1, wherein the first metalized surface and the second metalized surface comprises Ti—TiW—Cu—Ni—Au.

3. The power electronics assembly of claim 1, wherein the second metalized surface of the ceramic layer is bonded to the surface of the cold plate by one of a solder and a metalized epoxy.

4. The power electronics assembly of claim 1, wherein the power device assembly is embedded within one or more circuit board layers.

5. The power electronics assembly of claim 1, further comprising a first active brazing layer between the first metal layer and the graphite layer and a second active brazing layer between the second metal layer and the ceramic layer.

6. The power electronics assembly of claim 1, wherein the first metalized surface does not extend to a perimeter edge of a first surface of the ceramic layer and the second metalized surface does not extend to a perimeter edge of a second surface of the ceramic layer.

7. The power electronics assembly of claim 1, further comprising a printed circuit board comprising:
   a first dielectric layer comprising a power device opening, wherein the power device is disposed within the power device opening;

a second dielectric layer disposed on the first dielectric layer and the power device;
a first power layer comprising one or more first electrically conductive regions separated by one or more insulation regions;
a third dielectric layer disposed on the first power layer;
a second power layer disposed on the third dielectric layer comprising one or more second electrically conductive regions; and
a plurality of electroplated vias extending through one or more of the second dielectric layer, the first power layer, the third dielectric layer, and the second power layer.

8. A power electronics assembly comprising:
a power device assembly comprising:
an S-cell comprising:
a first metal layer comprising a recess;
a first graphite layer bonded to the first metal layer;
a ceramic layer comprising a first metalized surface and a second metalized surface, wherein the first metalized surface is bonded to the first graphite layer;
a second graphite layer bonded to the second metalized surface of the ceramic layer;
a second metal layer bonded to the second graphite layer; and
a power device disposed within the recess of the surface; and
a cold plate, wherein the second metal layer is bonded to a surface of the cold plate.

9. The power electronics assembly of claim 8, wherein the first metalized surface and the second metalized surface comprises Ti—TiW—Cu—Ni—Au.

10. The power electronics assembly of claim 8, wherein the second metal layer is bonded to the surface of the cold plate by one of a solder and a metalized epoxy.

11. The power electronics assembly of claim 8, wherein the power device assembly is embedded within one or more circuit board layers.

12. The power electronics assembly of claim 8, further comprising a first active brazing layer between the first metal layer and the first graphite layer, a second active brazing layer between the first graphite layer and the first metalized surface of the ceramic layer, a third active brazing layer between the second metalized surface of the ceramic layer and the second graphite layer, and a fourth active brazing layer between the second graphite layer and the second metal layer.

13. The power electronics assembly of claim 8, wherein the first metalized surface does not extend to a perimeter edge of a first surface of the ceramic layer and the second metalized surface does not extend to a perimeter edge of a second surface of the ceramic layer.

14. The power electronics assembly of claim 8, further comprising a printed circuit board comprising:
a first dielectric layer comprising a power device opening, wherein the power device is disposed within the power device opening;
a second dielectric layer disposed on the first dielectric layer and the power device;
a first power layer comprising one or more first electrically conductive regions separated by one or more insulation regions;
a third dielectric layer disposed on the first power layer;
a second power layer disposed on the third dielectric layer comprising one or more second electrically conductive regions; and
a plurality of electroplated vias extending through one or more of the second dielectric layer, the first power layer, the third dielectric layer, and the second power layer.

15. A method of fabricating a power electronics device assembly, the method comprising:
fabricating one or more power device assemblies by:
bonding a first metal layer to a first surface of a graphite layer;
bonding a second metal layer to a second surface of the graphite layer;
bonding the second metal layer to a first metalized surface of a ceramic layer;
forming a recess within the first metal layer; and
disposing a power device within the recess.

16. The method of claim 15, further comprising inserting the one or more power device assemblies into one or more openings of a first dielectric layer.

17. The method of claim 16, further comprising bonding the one or more power device assemblies and the first dielectric layer to a surface of a cold plate by a bonding layer.

18. The method of claim 17, wherein the bonding layer is one of a solder layer and a metalized epoxy.

19. The method of claim 17, further comprising:
disposing a second dielectric layer on the one or more power device assemblies and the first dielectric layer;
disposing a power layer subassembly on the second dielectric layer, the power layer subassembly comprising a first power layer comprising one or more first electrically conductive regions separated by one or more insulation regions, a third dielectric layer, and a second power layer disposed on the third dielectric layer;
drilling a plurality of first vias through the second power layer and the third dielectric layer, and laser drilling a plurality of second vias through the second power layer, the third dielectric layer, the first power layer, and the second dielectric layer;
electroplating the plurality of first vias and the plurality of second vias; and
etching the second power layer to form a plurality of second electrically conductive regions.

20. The method of claim 19, wherein the second power layer is etched by a laser etching process.

* * * * *